United States Patent [19]

Hamagami et al.

[11] 4,279,682

[45] Jul. 21, 1981

[54] APPARATUS FOR SECURING TAPE TO LEADS OF SEMICONDUCTOR LEAD FRAME

[75] Inventors: Teruaki Hamagami, Koganei; Kazuo Maetani, Higashiyamato; Fumio Sato, Hamuramachi, all of Japan

[73] Assignee: Sumitomo Metal Mining Company Limited, Tokyo, Japan

[21] Appl. No.: 90,697

[22] Filed: Nov. 2, 1979

[30] Foreign Application Priority Data

Nov. 2, 1978 [JP] Japan .................................. 53/135555

[51] Int. Cl.³ .............................................. B32B 31/00
[52] U.S. Cl. ................................... 156/367; 156/261; 156/515; 156/518; 156/519; 156/583.1
[58] Field of Search ............... 156/515, 516, 518, 520, 156/530, 251, 261–262, 265, 353–355, 583.3, 367, 583.1

[56] References Cited

U.S. PATENT DOCUMENTS

| 1,628,338 | 5/1927 | Skov | 156/518 X |
|---|---|---|---|
| 2,441,164 | 5/1948 | Miller | 156/518 X |
| 2,543,678 | 2/1951 | Tumulo | 156/261 X |
| 3,047,053 | 7/1962 | Howard | 156/583.3 X |
| 3,195,180 | 7/1965 | Jagger et al. | 156/261 X |
| 3,597,816 | 8/1971 | Zelenz | 156/261 X |
| 3,711,625 | 1/1973 | Dupuis | 156/261 X |
| 3,784,439 | 1/1974 | Dorman | 156/261 X |

*Primary Examiner*—David A. Simmons
*Attorney, Agent, or Firm*—Watson, Cole, Grindle & Watson

[57] ABSTRACT

An apparatus for securing a tape to leads of a semiconductor lead frame, includes, a tape feeder, a punch for punching the tape and for pressing the punched tape against the lead frame, a mechanism for horizontally moving the lead frame and setting it in the punch and the press, and a mechanism for adjusting the timing of the feeder, the punch, the press and the moving mechanism. The punch and the press include a fixed upper die on which the lead frame rests and in which the tape is supported, the punch being movable against the tape for punching out a portion of the tape and for pressing it against the lead frame.

22 Claims, 15 Drawing Figures

APPARATUS FOR SECURING TAPE TO LEADS OF SEMICONDUCTOR LEAD FRAME

BACKGROUND OF THE INVENTION

1. Field of the Invention

This invention relates generally to a tape securing apparatus, and more particularly to such an apparatus for pasting a heatproof and nonthermoflexible insulating tape on leads of a semiconductor lead frame in such a manner as to leave the connecting parts of connector wires at the tips of the leads so as to eliminate the stepped formation normally present at the lead tips.

2. Description of the Prior Art

A semiconductor lead frame, formed by a pressing or an etching operation, may have twenty or more leads and may be of a complex shape. During formation of the lead frame by such a pressing or etching process, a stepped formation (either above or below) may be inadvertently formed in the long cantilever-shaped lead tips by forces imposed during the pressing operation or by forces occurring during the handling of the lead frame.

Such a stepped formation may cause a break in the connector wires when a semiconductor pellet is connected to a tab part of the semiconductor lead frame and when each electrode of the semiconductor pellet is connected to a corresponding lead through the connector wire or after a resin molding. It is therefore found convenient to interconnect among leads by means of a tape. However, such a connecting operation is typically carried out manually thereby requiring much time and care. No known apparatus is available for carrying out this tape connecting operation in an efficient and expedient manner.

SUMMARY OF THE INVENTION

An object of the present invention is therefore to provide an apparatus for securing insulating tape portions in place so as to leave the connecting parts of the connector wires at the lead tips of a semiconductor lead frame constituted by several interconnected semiconductor lead frame units cut in the form of a plate, or by lead frame units series connected together in the form of a web or belt.

Other objects, advantages and novel features of the invention will become more apparent from the following detailed description of the invention when taken in conjunction with the accompanying drawings.

DETAILED DESCRIPTION OF THE INVENTION

Figure 1:
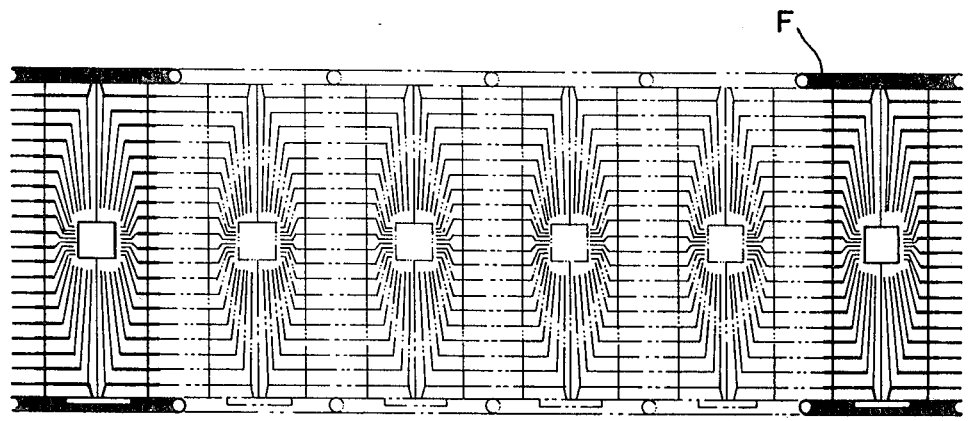
FIG. 1 is a top plan view of a semiconductor lead frame before the tape portions are secured in place and showing six interconnected lead frame units cut to form a plate.
Figure 2:
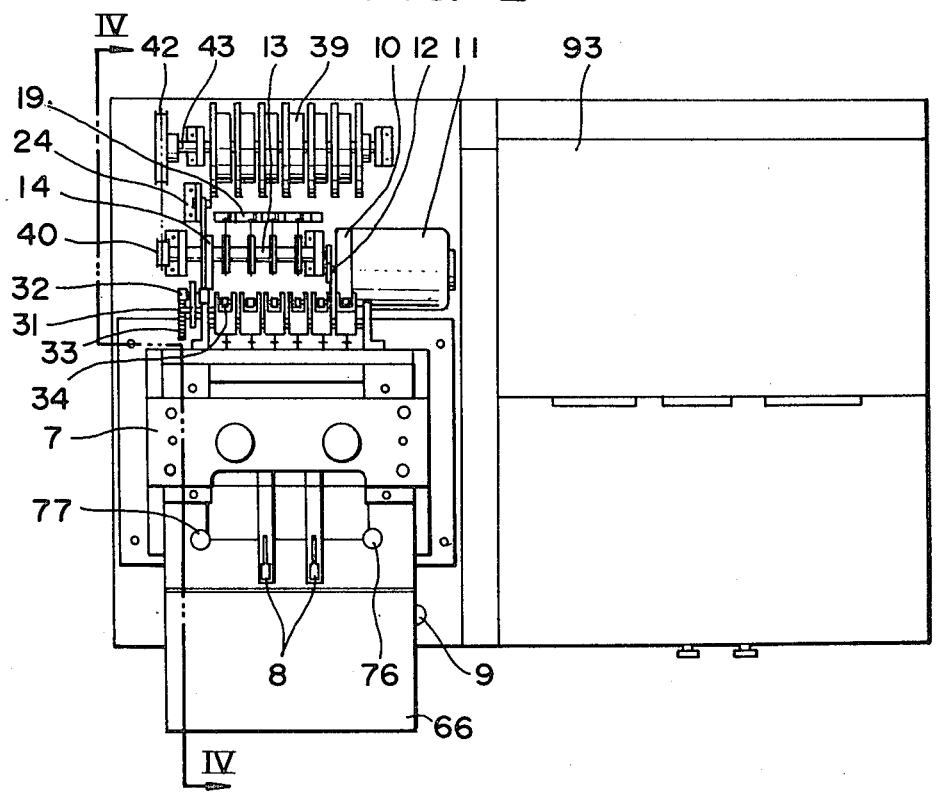
FIG. 2 is a top plan view of one embodiment of the tape pasting apparatus according to the invention.
Figure 3:
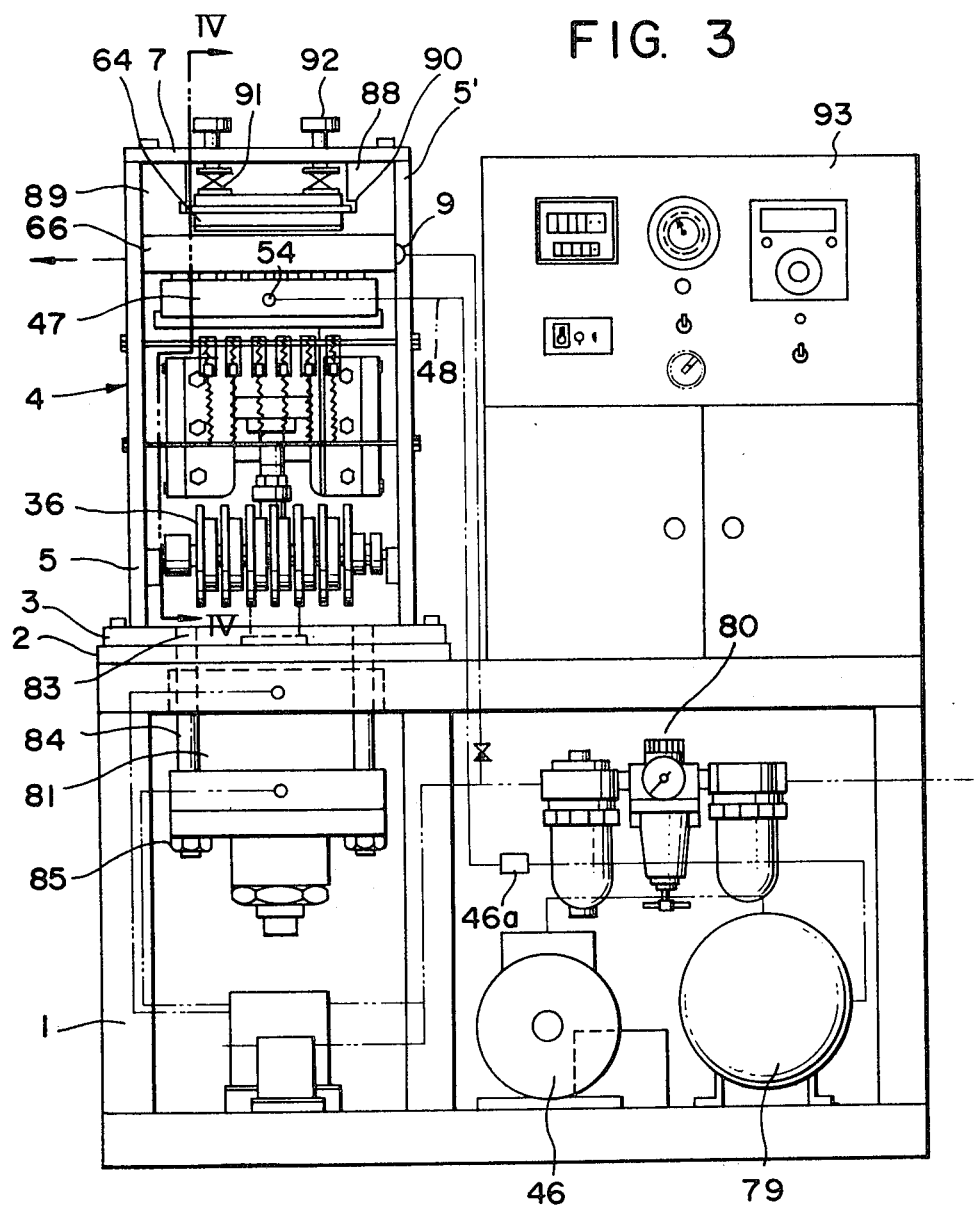
FIG. 3 is a side elevational view of the FIG. 2 apparatus.
Figure 4:
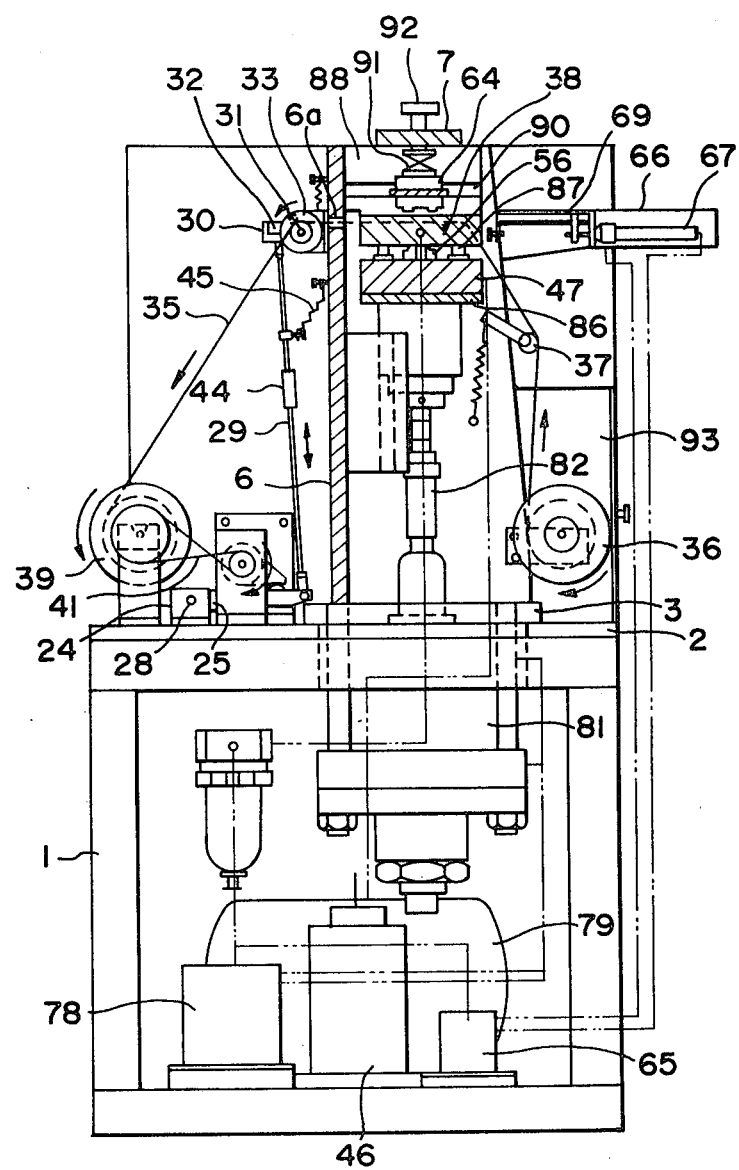
FIG. 4 is a partly sectioned end elevational view taken substantially along line IV—IV of FIGS. 2 and 3.

FIGS. 2 to 4 show an apparatus according to the invention for pasting punched tape portions to a six-series semiconductor lead frame F in which six interconnected semiconductor lead frame units are cut to form a plate as shown in FIG. 1.

The component elements of the apparatus will first be described. A lower plate 2 (FIGS. 3 and 4) is mounted on an underframe structure 1, and a press frame structure 4 extends upwardly from plate 2. Frame 4 includes a bottom plate 3 connected to plate 2 side plates 5, 5', a back plate 6 arranged to form a channel shape and an upper plate 7 spanning the side plates. An operating panel board 93 is mounted on the underframe structure 1 adjacent frame structure 4.

As to be hereinafter described in more detail, a cam drive shaft 13 (FIG. 2) supporting control cams control 5 the timing of the operation of those parts of the apparatus used in carrying out the invention. This cam shaft and a microswitch holder 19 are mounted on plate 2 behind plate 6, and a tape feed roller 31 is mounted on back plate 6 for the feeding of an elongated insulating tape or tapes 35. A heater 64, die 38 and a lower die 47 are all located within frame 4. The lower die 47 is connected to a piston rod 82 of a main cylinder 81. A lead frame preparation table 66, lying adjacent a lead frame feed table 69, extends horizontally outwardly from the front surface of the press frame 4.

Figure 5:
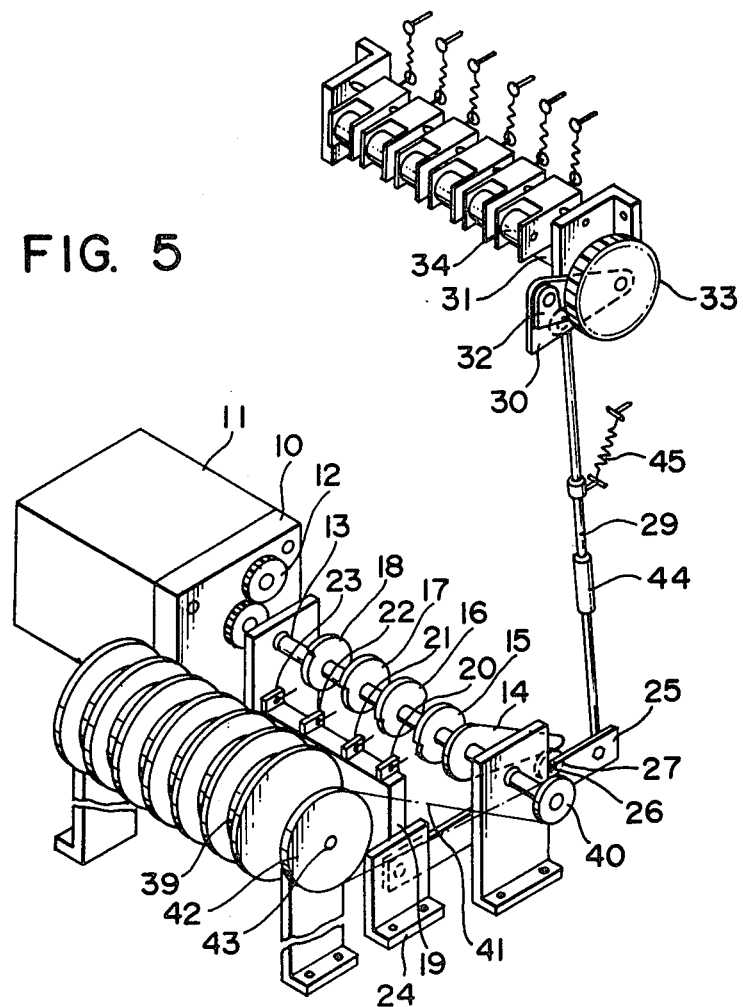
FIG. 5 is a perspective view illustrating the relationship between the timing control mechanism and the tape feeding mechanism of an apparatus.

The timing control mechanism is shown in detail in FIGS. 2 and 5. An operating motor 11 for the apparatus is mounted on a support plate 10 affixed to plate 2, and a start button 9 for starting the motor 11 is operatively positioned for convenience at a side of table 66. Rotation of the motor shaft is transmitted to cam drive shaft 13 by means of a spur gear 12. Five cams are spaced along shaft 13 and are mounted for rotation therewith. These cams include a tape feed cam 14, a motor switch cam 15, a vacuum pump cam 16, a lead frame feed cam 17 and a main cylinder cam 18. Microswitches 20, 21, 22 and 23, respectively associated with cams 15, 16, 17 and 18 are mounted on microswitch holder 19. As will be described in more detail hereinafter, these cams 14 to 18 operate for only predetermined periods of time (shown in FIG. 6) to control the timing of the tape feeding, the motor driving, the vacuum pump 46 operation, the setting of lead frame F and the up-and-down movement of lower die 47 effected by main cylinder 81.

Figure 7:
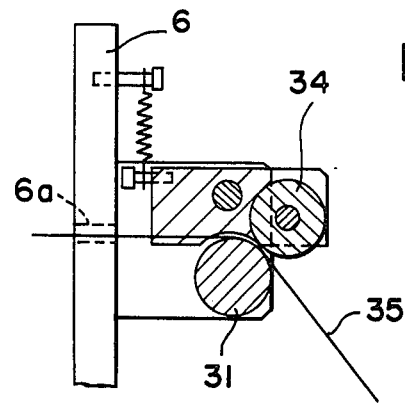
FIG. 7 is a partly sectioned detailed view of a tape feed roller of the apparatus.
Figure 8A:
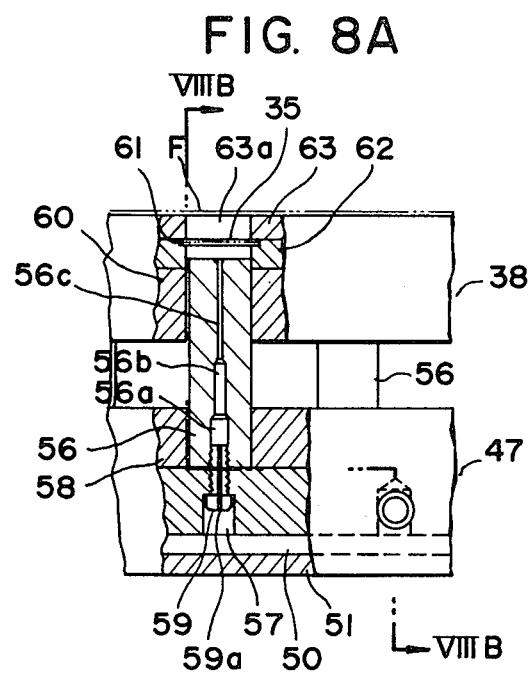
FIG. 8A is a partly sectioned elevational view of the tape punch mechanism of the apparatus.
Figure 8B:
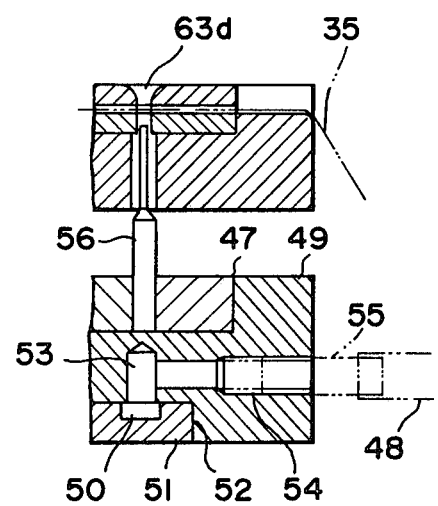
FIG. 8B is a sectioned side view of the tape punch mechanism taken substantially along line VIII–VIIIB of FIG. 8A.

Concerning the tape feed mechanism, a plurality of parallel elongated insulating tapes 35 are wound on a tape storage reels 36 (FIG. 4), and are arranged to pass about tension rollers 37 and each through channels 61 (only one of which is shown in FIG. 8A) provided in upper die 38. Each tape is punched and pressed into place at this station (in a manner to be detailed later) and continues on its path through an opening 6a provided in back plate 6. The each tape proceeds through a tape feed roller 31 and an idler roller 34 (FIG. 7) after which it is wound up on a rewind reel 39 (FIG. 4).

A predetermined length of each tape is intermittently moved through the punching and pressing station by a mechanism shown in detail in FIGS. 5 and 7. A bracket 24 is mounted on plate 2, and a lever arm 25 is pivotally mounted at one end to the bracket by means of pin 28. A roller 27, mounted on the arm for rotation near its opposite end by a bolt 26, is disposed for contacting the projection of tape feed cam 14. A tape feed adjusting rod 29 is pivotally connected at one end to the free end of arm 25 and is connected at its opposite end to a ratchet pawl plate 30 having a ratchet pawl 32 mounted thereon. This pawl engages with a ratchet wheel 33, mounted on one end of roller 31 for rotation therewith, so as to rotate the ratchet and the roller 31 by a predetermined angle whenever rod 29 is lowered by the operation of cam 14. As shown in FIG. 7, idler rollers 34 press against roller 31 so that each tape 35 disposed between the two rollers is fed forwardly by the rotation of roller 31.

Tape rewind reels 39 are mounted on a shaft 43 (FIG. 5) of a pulley 42 in such a manner as to be able to slip on this shaft with a small torque to thereby maintain a predetermined tension in the tapes. The pulley 42 is operatively connected via a belt 41 with a pulley 40 which is mounted on cam drive shaft 13 for rotation therewith. Thus, shaft 43 will continue to rotate while motor 11 operates, although reels 39 will rotate to wind up tapes 35 only when the tapes are fed from tape feed roller 31 but will slip on shaft 43 when the tape is not so fed thereto.

It should be pointed out that adjusting rod 29 has an internally threaded sleeve 44 for adjusting the spacing between ends of cooperating rod sections to thereby adjust the length of the rod. The tape feed pitch may therefore be adjusted, and a spring 45, connected to the rod at one end and to plate 6 at its other end, is provided for returning rod 29 to its initial raised position after it is lowered upon the operation of cam 14.

The mechanism for punching the tapes and pasting the punched portions to the lead frame F will now be described. Referring to FIGS. 3 and 4, upper die 38 is mounted at opposite ends to fixed plates 88 and 89 suspended by bolts (not shown) from upper plate 7 and welded to the side plates. Heater 64 is spaced above the upper die 38 and has a flange projecting into grooves 90 provided in plates 88 and 89. The grooves are wider than the thickness of this flange so that the heater 64 is capable of slightly moving up and down. Springs 91 are provided between the heater 64 and upper plate 7 for spring biasing the heater 64 downwardly with the force adjusted by screws 92 provided on the upper plate 7.

Lower die 47 is disposed below the upper die for vertical movement relative thereto and engages guide posts 87 depending from the upper die 38. The lower die rests on a support plate 86 disposed at the upper end of a piston rod 82 of main cylinder 81. The main cylinder 81 is fixed to the plate 3 by means of bolts 84, whose upper ends 83 being secured to the plate 3, and nuts 85.

The details of the upper and lower dies are illustrated in FIGS. 8A, 8B, 9A and 9B. On the bottom surface of a punch chase 49 of the lower die 47, a recess 52 is provided for the reception of a plate 51 having a groove 50 open at its upper surface. A vertical hole 53 extends from recess 52 and a horizontal hole 54 opens from hole 53 into the side surface of the punch chase. Hole 54 is internally threaded at its inlet for engagement with an externally threaded pipe conduit 55 which is connected to a vacuum pump 46 (FIG. 3) via a plastic pipe 48, an electromagnetic valve 46a and a vacuum tank 79.

Figure 9A:
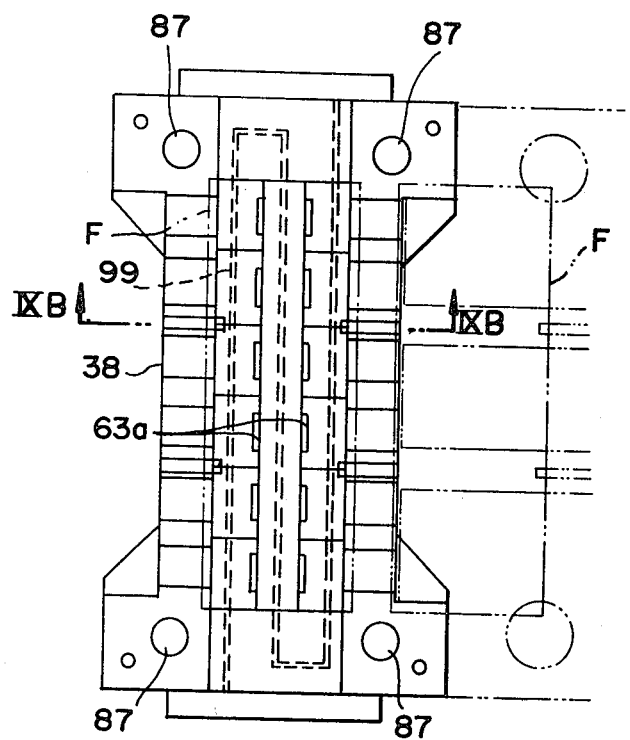
FIG. 9A is a top plan view of an upper die forming part of the tape punch mechanism.
Figure 9B:
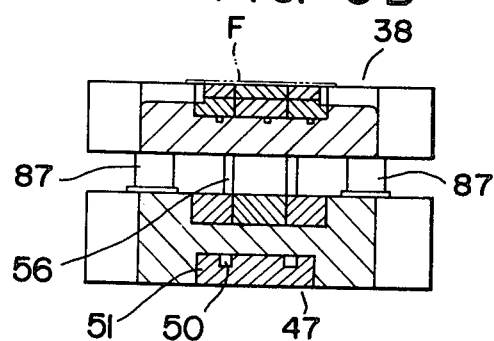
FIG. 9B is a sectional view taken substantially along line IXB—IXB of FIG. 9A.

Punch members 56 (one pair for each tape and disposed coaxially with die holes 63a shown in FIG. 9A) extend upwardly from and are supported by lower die 47. A hole 57 beneath each punch member communicates with groove 50 and receives a bolt 59 engaging the punch member 56. Each such member is seated within a punch block 58, and bolt 59 has a small axial passage 59a. Coaxially aligned passages 56a, 56b and 56c are provided in the punch member between opposite ends thereof. Therefore during the suctioning effect produced by vacuum pump 46, suction will be transmitted through pipe 48, pipe 55, holes 53 and 54, groove 50, hole 57, and coaxial holes 59a, 56a, 56b and 56c so that suction is applied to each tape 35 when it contacts the upper end of punch members 56. It should be pointed out that a plurality of vertical passages 56c, such a plurality of passages branching off from passage 56b and being spaced apart so as to transmit a spaced apart suction effect therethrough to the tape.

The upper die 38 has a die chase 60 thereof provided with holes through which each punch member 56 extends, and is further provided in an upper surface thereof with a stripper 62 having a passage groove 61 for accomodating the passage of tape 35 across the punching members. And, the upper die includes a punch die plate 63 having a die hole 63a (female cutting die) therein for cooperation with punch member 56 to effect the punching operation. The upper die 38 is further provided with a cooling passage 99 (FIG. 9A) for the cooling of the heat produced by heater 64 as cooling air or liquid flows through such passage.

Main cylinder 81, which moves the lower die up and down, is connected to a source of air under pressure via an air control unit 80 (FIG. 3) which is controlled by an electromagnetic valve 78 (FIG. 4).

The mechanism for setting the semiconductor lead frame F on upper die 38 is shown in FIGS. 2, 4, 10A and 10B. A feed table 69 disposed at the same elevation as preparation table 66 is provided with slits 70 and 71 into which feed pawls 8 extend at the front of the upper die. A forward portion of feed table 69 is depressed below the upper surface thereof as at 72. A lead frame F is manually set in the depression in engagement with pawl portions 8a of feed pawl 8. Vertical holes 76 and 77 extend through table 69 at the rear corners of depressed portion 72 to facilitate the manual removal of lead frame F after it is retracted by the pawl upon completion of the tape pasting operation.

A pressure cylinder 67 is mounted on table 66 below the upper surface thereof, and a piston rod 68 of this cylinder is fixed to a lower portion of pawl 8. A vertical plate 75 is mounted to the under side of table 69 and has a guide bar 73 extending between plate 75 and table 66 for guiding the movement of piston rod 68 therealong. An adjustment screw 74 on plate 75 is provided for adjusting the stopping position of the piston rod. Cylinder 67 is operatively connected with a source of a air under pressure via a control unit 80 which is controlled by electromagnetic valve 65. Extension of the piston rod advances pawl 8 and the lead frame to the punching and pressing station, and thereafter returns the pasted frame to the FIG. 10A position upon retraction.

Having described the details of the present machine, the actual tape pasting operation will now be described.

Figure 6:
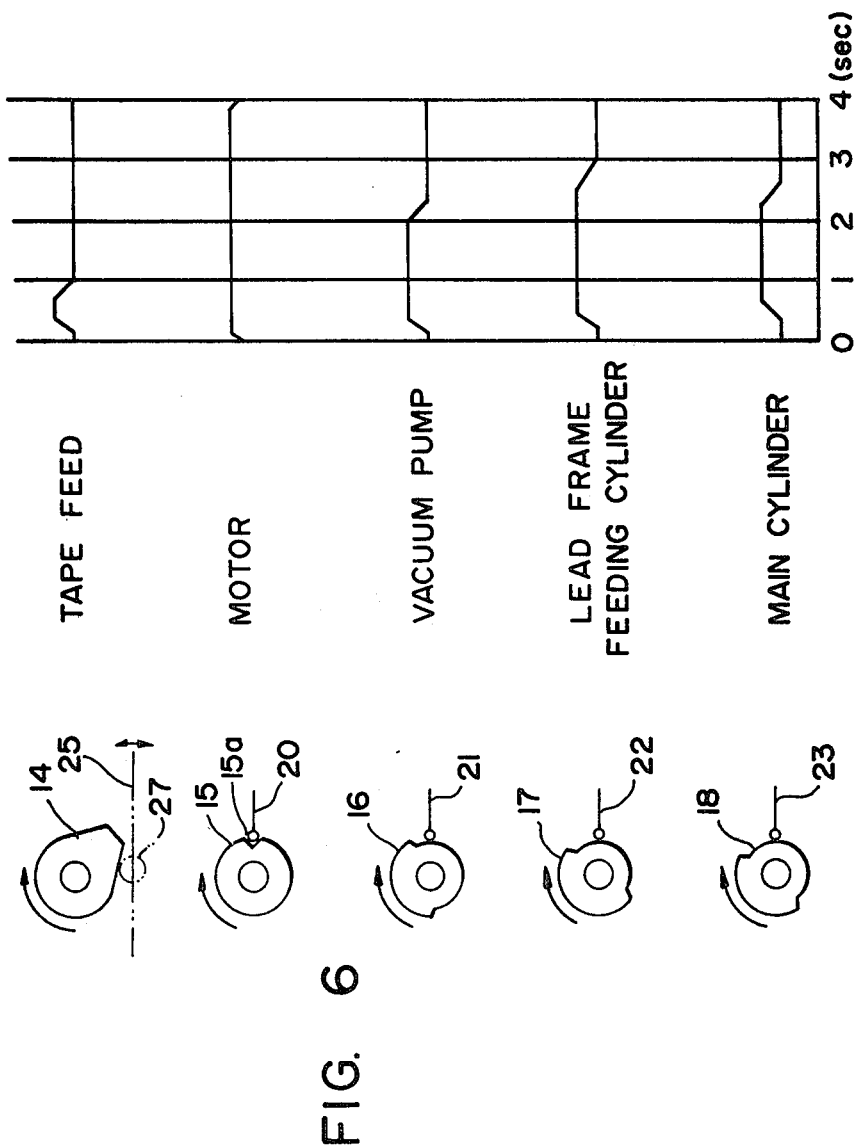
FIG. 6 is a view illustrating the synchronous timing effected by the cams.
Figure 10A:
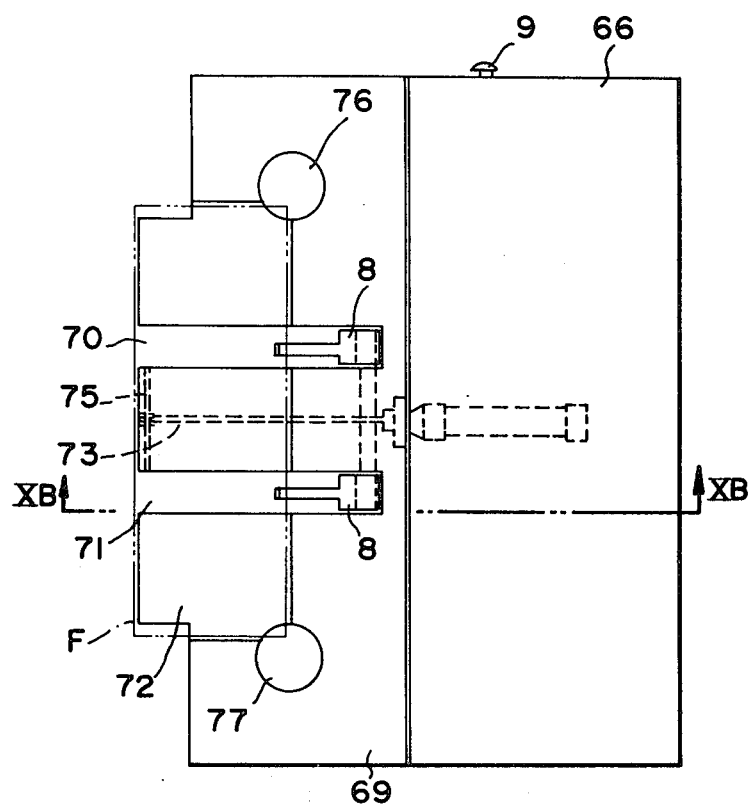
FIG. 10A is a top plan view of a lead frame moving mechanism in relation to preparation and feed table.
Figure 10B:
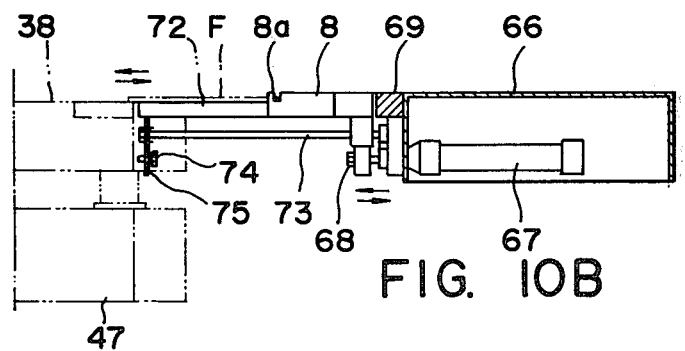
FIG. 10B is a detail sectional view of the feed mechanism taken substantially along line XB—XB of FIG. 10A.

Firstly, a lead frame F on which tape portions are to be pasted, is manually set in position relative to feed pawl 8 as shown in FIGS. 10A and 10B. Then, when start button 9 is pushed, motor 11 operates to rotate cam drive shaft 13 via spur gear 12. The speed of the motor can be made constant or adjustable in any normal manner. In this embodiment the descriptions shall be applied to the case wherein the drive shaft 13 is made to complete, for example, one rotation in four seconds. Cams 14 to 18, fixed to shaft 13, rotate together therewith, the cams being oriented on the shaft as shown in FIG. 6. Thus, in the high level range of the graph shown to the right in this Figure, cam 14 will contact roller 27, and cams 15, 16, 17 and 18, will respectively contact microswitches 20, 21, 22 and 23. As can be seen, at the time start button 9 is depressed, motor switch cam 15 will contact microswitch 20 so that motor 11 will continue to operate without having to maintain the start button 9 pushed. After cam 15 completes one revolution whereupon its cutout 15a lies adjacent to microswitch 20 as shown in FIG. 6, motor 11 is stopped since cam 15 no longer contacts microswitch 20.

During rotation of cam drive shaft 13, tape feed cam 14 presses against roller 27, shown in FIG. 5, to thereby depress tape feed lever 25. Ratchet wheel 33 will therefore be rotated through a predetermined angle by pawl 32, and tape feed roller 31 will correspondingly rotate so that tapes 35 pressed thereagainst by contact rollers 34 will be payed out a predetermined length. When tape feed cam 14 disengages from roller 27, tape feed lever 25 will return to its initial raised position by spring 45 and the feed of tapes 35 will be stopped.

The graph to the right of FIG. 6 shows the synchronous operation between the five cams during the rotation of the shaft 13. Vacuum pump cam 16 is so oriented as to contact microswitch 21 in synchronism with the start of the tape feeding operation to thereby cause electromagnetic valve 46a of vacuum pump 46 to open which produces a suction transmitted to passage 56c of each punch member 56 (FIG. 8A).

Lead frame feed cam 17 is so oriented as to contact microswitch 22 slightly after the tape feed and vacuum pump operations so that electromagnetic valve 65 will be operated for admitting compressed air into cylinder 67 to thereby cause its piston rod 68 to extend (in the direction to the left in FIGS. 10A and 10B) whereupon feed pawl 8 connected to the piston rod will correspondingly advance and lead frame F will be conveyed from its position at the right to its position shown at the left in FIG. 9A.

Following the commencement of the lead frame operation, main cylinder cam 18 is so oriented as to contact microswitch 23 to thereby operate electromagnetic valve 78 permitting compressed air to be fed to main cylinder 81. Piston rod 82 will thus be raised for correspondingly raising lower die 47 as guided by posts 87 which extend downwardly from the upper die. Punch member 56 (FIG. 8A) will thus be raised to punch through tape 35 as the punch number moves into die hole 63a. Because of the vacuum effect, suctioning takes place during the raising of the lower die and continuous until just before the main cylinder operation is completed. Punch member 56 therefore moves through die hole 63a while the punched tape portion is suctioned thereto, so that is will press the punched tape portion against the lower surface of lead frame F resting on the upper surface of the upper die at a predetermined position. Punch member 56 will continue to be raised while pressing the tape piece against the lower surface of the lead frame so as to lift the lead frame and press it against heater 64. The heater thus heats the lead frame and the tape piece will be pressed against the lead frame under the action of spring 91. The tape has a thermosetting and heatproof binder at its upper surface so that the bonding force thereof as increased by heat will effect securement of the punched portions at predetermined positions to lead frame F.

At the end of the tape pasting operation, vacuum pump cam 16 will disengage from microswitch 21, the electromagnetic valve 46a of the vacuum pump 46 will be closed and suction of the tape by the punch member 56 will be stopped. Then the main cylinder cam 18 will be free from engagement with the microswitch 23, the air circuit will be changed over by electromagnetic valve 78, compressed air will be fed above the main cylinder 81, piston rod 82 will lower and, at the same time, lower die 47 and punch members 56 will lower and lead frame F on which the tape piece is adhesively secured will be returned to the initial predetermined position of the upper die 38.

Lead frame feed cam 17 will then disengage from microswitch 22, the air current will be changed over by electromagnetic valve 65, compressed air will be fed into cylinder 67 causing piston rod 68 and feed pawls 8 to retract so that the pasted lead frame (see FIG. 11) will be pulled back by pawls 8 onto feed table 69. Since the rear corners of the lead frame extend onto holes 76 and 77, the completed lead frame can be easily lifted from table 69 by the operator inserting his fingers through these holes enough to grasp the corners and lift up on the lead frame.

Lastly, motor switch cam 15 will disengage from microswitch 20 thereby causing the motor to stop after completing one cycle of revolution.

Figure 11:
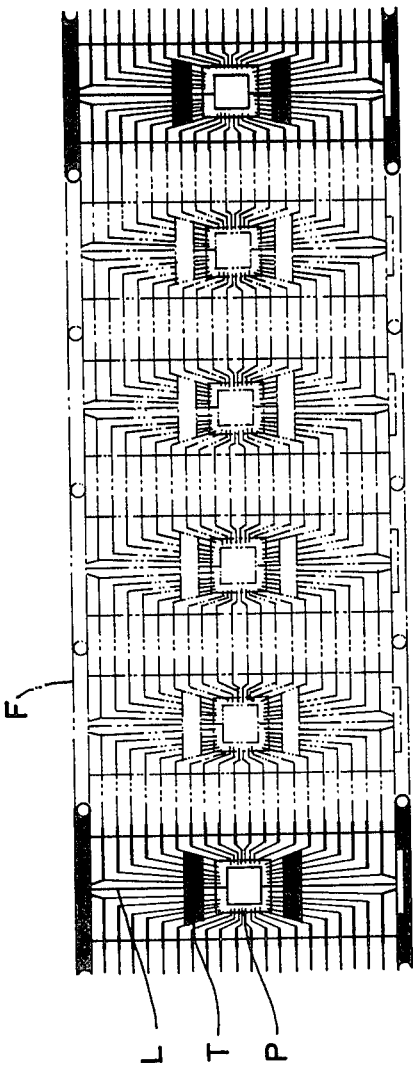
FIG. 11 is a top plan view of the FIG. 1 plate after the tape portions are secured in place.

Lead frame F on which the tape portions are pasted is shown in FIG. 11 as including tape pieces T pasted so as to intersect at right angles with a tab supporting lead L in such a manner as to leave free the connecting part P of the connector wire.

Figure 12:
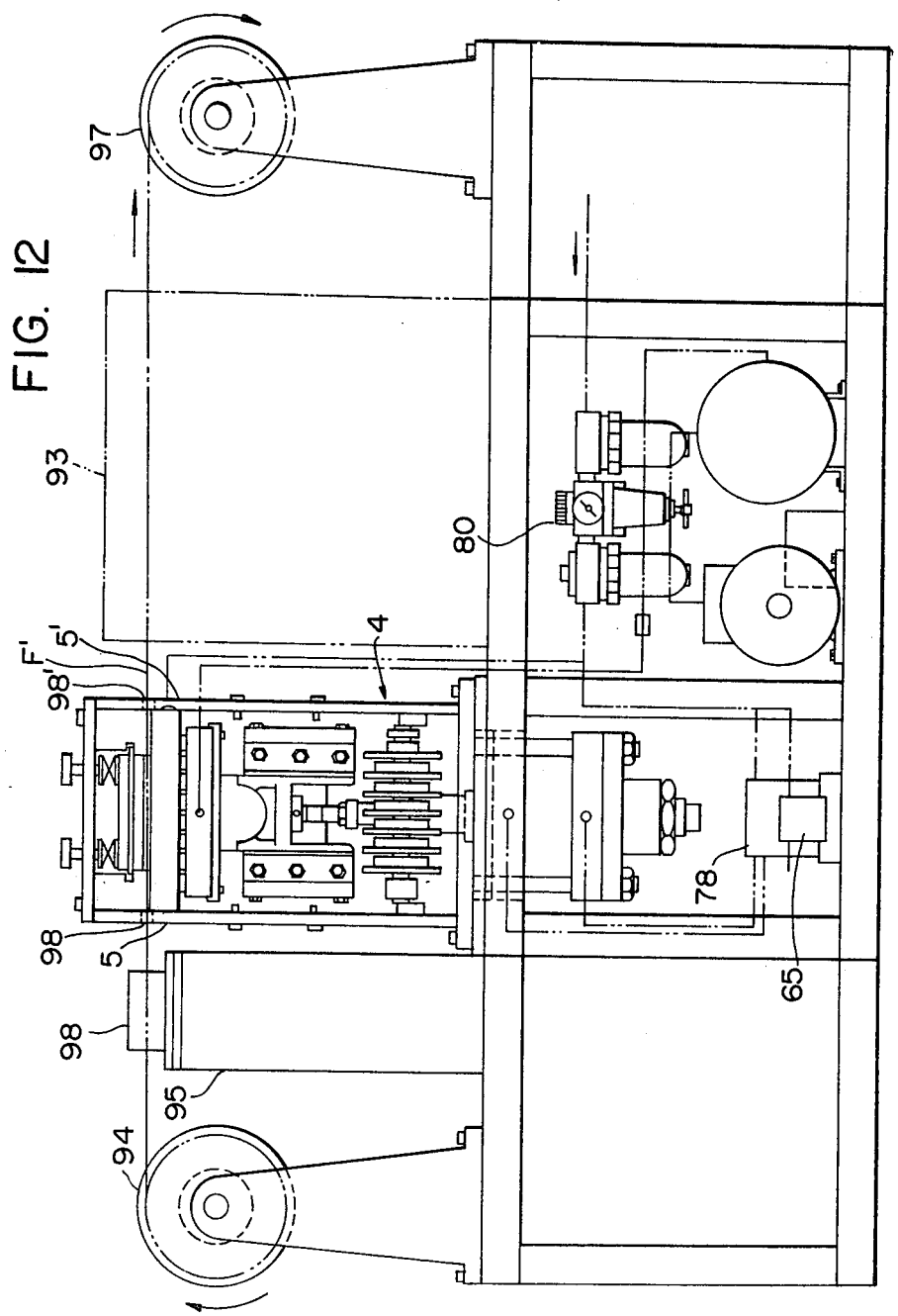
FIG. 12 is a side elevational view of another embodiment of an apparatus according to the invention.

An apparatus according to another embodiment is shown in FIG. 12 for continuously pasting taped portions onto a belt or web of semiconductor lead frame units series connected together. The tape feed conveying, punching and pasting operations are the same as that described with reference to FIGS. 2 to 10. However, the lead frame belt or web F' is wound on a storage reel 94 located on one side of pressing frame 4 and passes between the upper die and the heater to takeup reel 97 located on the other side of the pressing frame. A feed gripper 96 is operatively positioned on a mount 95 between the press frame 4 and reel 94. Slits 98, 98' are provided in the side plates of the pressing frame through which lead frame F' passes. The gripper 96 may comprise any known means for intermittently feeding the belt or web, in the direction of the arrow in FIG. 12, as such means engages the web, moves it forwardly, disengages the web; and so on.

Since the operation is continuous, notch 15a of motor switch cam 15 is eliminated so that microswitch 20 will be in constant contact by cam 15 for continuously rotating motor 11. And, since feed gripper 96 is used in lieu of lead frame feed cylinder 67, lead frame feed cam 17 is associated with the gripper for operation thereof similarly as described with reference to the first embodiment.

The tape pasting operation is therefore similar to that described for the first embodiment except for the starting and stopping of the motor to accommodate insertion and removal of the individual lead frame plate. Thus, the continuous lead frame F', is wound onto reel 94. The leading end of this continuous lead frame F' is secured to wind up reel 97 as the lead frame passes through feed gripper 96 through slit 98, between the upper die and the heater and through slit 98'.

When start button 9 is pushed, operation of motor 11 is started and, by operation of tape feed cam 14 as aforedescribed, tapes 35 will be fed a predetermined length and then stopped. Vacuum pump cam 16 will commence synchronous operation with that of the tape feed operation and vacuum pump 46 will begin suctioning. Then, lead frame feed cam 17 will contact microswitch 22 for operating electromagnetic valve 65 whereupon compressed air will be fed to feed gripper 96 so that lead frame F' will be gripped and will be advanced a predetermined length so that a portion of the lead frame on which the tape is to be pasted will be conveyed to the punching and pressing station. When the lead frame thus is conveyed, main cylinder cam 18 will function to paste tape pieces to lead frame F' in accordance with the same process as aforedescribed. When the pasting operation is completed, the vacuum pump operation ceases as before, and the main cylinder operation likewise ceases so that the lower die will return to its original lowered position. When lead frame feed cam 17 disengages from microswitch 22, the operation of electromagnetic valve 65 ceases so that feed gripper 96 will release lead frame F', whereafter the gripping and release operation of the feed gripper will continue upon each revolution of cam 17. The lead frame on which the pasting of the tape is completed will be wound up on reel 97 which is driven in any normal manner.

As can be seen from the aforegoing, the apparatus according to the invention permits the feeding of the tape, the feeding of the lead frame and the punching and pasting of the tape all to be carried out automatically. More particularly, as the punched tape is vaccum suctioned onto the ends of the punch members 56, the tape 35 will not become deformed and is capable of being pasted accurately in a desired position to the lead frame F'. And, even if the sharpness of the male and female elements of the punch deteriorates, such will not influence the positioning of the tape so that the need for any adjustments affecting the sharpness of the punch is substantially eliminated.

The spaced relationship between the upper die 38 and the heater 64 and the cooling provision made for the heater substantially reduces any thermal expansion of the die so as to thereby preserve its dimensional precision. No interference or snagging will therefore occur between the punch and the die, and the clearance therebetween can be reduced for improving on the sharpness of the punch. Moreover, since the die will not become unduly heated, any adherence between the tape and the die is substantially avoided.

Since a plurality of connected semiconductor lead frame units (either in the form of plates as in FIG. 1 or a continuous web or belt as in FIG. 12) can be pasted all at once in accordance with the invention, it can be seen that the operating efficiency is quite high.

Obviously, many other modifications and variations of the present invention are made possible in the light of the above teachings. It is therefore to be understood that within the scope of the appended claims, the invention may be practiced otherwise than as specifically described.

What is claimed is:

1. An apparatus for the pasting of at least one tape portion from at least one elongated tape onto at least one lead frame unit, comprising, a machine frame, means on said frame for intermittently feeding a predetermined length of insulated tape to a punching and pasting station, means for punching said tape at said station to produce said tape portion and for pressing said tape portion against said lead frame unit, meand for horizontally moving said lead frame unit from a feed table to said punching and pressing means at said station, means on said feed table for positioning a plate comprised of a plurality of interconnected lead frame units, said positioning means being defined by an upper surface of said feed table having a depression therein for the reception of the plate, plate access holes extending through said table and overlapping with portions of said depression to thereby provide access for the manual removal of the plate from said table, said moving means including plate engaging means and means for reciprocating said plate engaging means for setting the plate at said station and for returning the plate to said table after being pasted, and means for timing the operation of said feeding means, said punching and pressing means and said moving means, said punching and pressing means including a stationary upper die member having a surface on which said lead frame unit is supported, means in said die member for supporting said tape a spaced distance from said surface, and a punch member movable toward and away from said surface for punching said tape.

2. The apparatus according to claim 1, wherein said upper die member has a punch hole through which said punch member passes, said tape supporting means in said die member comprising a channel lying perpendicular to the direction of movement of said punch member, said punch hole being defined by a female cutting die for punching the tape in cooperation with said punch member.

3. The apparatus according to claim 1, wherein said punch member has at least one suction passage extending through a terminal end thereof, and said punching and pressing means include means for controlling transmission of a suction pressure to said suction passage from a suction pressure source, whereby the tape portion produced by said punch member is positively positoned on said terminal end before being pressed into place by said punching and pressing means.

4. The apparatus according to claim 1, wherein said punch member is supported by a lower die member provided for movement therewith, means for moving said lower die member and said supported punch member toward and away from said upper die member, and guide means between said die members for guiding said lower die member during its movement toward and away from said upper die member.

5. In the apparatus according to claim 4, wherein said punch member and said lower die member have interconnected suction passages extending from a terminal end of said punch member and connected with a suction pressure source so that the tape portion produced by said punch member is positively positioned on said terminal end before being pressed into place by said punching and pressing means.

6. In the apparatus according to claim 3, wherein means are provided for moving said punch member toward and away from said surface of said upper die member, said means for controlling the operation of said punching and pressing means being adapted for synchronizing the transmission of said suction pressure with the movement of said punch member.

7. In the apparatus according to claim 1, wherein said punching and pressing means includes a heating means in alignment with said punch member and being spaced a predetermined distance from said surface of said upper die member.

8. The apparatus according to claim 7, wherein said upper die member is provided with a cooling fluid passage.

9. The apparatus according to claim 7, wherein a spring is provided for spring biasing said heating means toward said surface.

10. The apparatus according to claim 9, wherein said punch member has a predetermined length relative to the thickness of said die member such that the terminal end of said punch member projects during its movement outwardly of said surface beyond said predetermined distance to thereby press said tape portion against said unit and to lift said unit and press it against said spring biased heating means for pasting the tape portion in place.

11. The apparatus according to claim 9, wherein means are provided for adjusting the force of said spring.

12. The apparatus according to claim 4, wherein said means for moving said lower die member and said supported punch member toward and away from said upper die member comprises a piston and cylinder unit, the cylinder of which being mounted on said frame and the piston thereof supporting said lower die member.

13. The apparatus according to claim 1, wherein said moving means includes reciprocating means for setting the lead frame at said punching and pasting station and for returning the lead frame to said table after being pasted.

14. The apparatus according to claim 1, wherein said moving means is adapted for moving the lead frame unit in a first predetermined direction, and said tape feeding means is adapted for feeding the tape in a second predetermined direction parallel to said first direction.

15. The apparatus according to claim 1, wherein said reciprocating means comprises a piston and cylinder unit, and means on said table for adjusting the length of the piston stroke to thereby adjust the distance at which said plate is set from said table.

16. The apparatus according to claim 1, wherein said timing means comprises a rotatable cam shaft having a plurality of cams thereon engageable with a corresponding number of microswitches provided for synchronizing the operation of said feeding means, said punching and pressing means and said moving means upon cam shaft rotation, and means for rotating said cam shaft.

17. An apparatus for the pasting of at least one tape portion from at least one elongated tape onto at least one lead frame unit, comprising, a machine frame, means on said frame for intermittently feeding a predetermined length of insulated tape to a punching and pasting station, said tape feeding means comprising a tape feed roller operatively engageable with an assembly including a rotatable feed cam, a pawl in operative engagement with said cam, a rachet wheel fixed to said feed roller for rotating same in only one direction for feeding a predetermined length of tape, a rotatable tape rewind shaft, means for rotating said shaft and said feed cam in synchronism, and a tape rewind wheel for rewinding the tape after the punching and pressing operation, said reel being mounted for slipping movement on said shaft for maintaining a predetermined tension in the tape upon tape rewind, means for punching said tape at said station to produce said tape portion and for pressing said tape portion against said lead frame unit, means for horizontally moving said lead frame unit from a feed table to said punching and pressing means including a stationary upper die member having a surface on which said lead frame unit is supported, means in said die member for supporting said tape a spaced distance from said surface, and a punch member movable toward and away from said surface for punching tape.

18. The apparatus according to claim 17, wherein said tape feeding means further comprises means for adjusting movement of the pawl of said assembly to thereby adjust the length of tape fed by said feeding means.

19. The apparatus according to claim 17, wherein said tape feeding means includes an idler roller bearing against said feed roller with the tape passing therebetween.

20. The apparatus according to claim 17, wherein said tape feeding means further comprises tape storage reel means for storing a plurality of parallel elongated insulating tapes wound thereon, portions of said tapes being punched and pressed in place by said punching and pressing means.

21. An apparatus for the pasting of at least one tape portion from at least one elongated tape onto at least one lead frame unit, comprising, a stationary upper die having an upper surface on which said lead frame unit is supported and further having punch channels opened for pressing punched tape portions against said lead frame unit and a tape channel internally lying perpendicular to said punch channels, a lower die having punch members passing through said punch channels to punch the tape, said punch members being provided with suction means for suctioning the punched tape portion by vacuum so as to register said tape portion with a pasting position of said lead frame unit, said lower die further having means for moving said punch members toward and away from said upper die such that the terminal ends of said punch members project outwardly of the upper surface of said upper die at the end of the movement of said punch members toward said upper die, heating means spaced a predetermined distance from said upper surface of said upper die and biased by a spring means toward said upper die, means for feeding a predetermined length of said tape passing through said tape channel of said upper die, and means for setting the lead frame to a predetermined position on said upper surface of said upper die.

22. An apparatus for the pasting of tape portions from at least on elongated tape onto lead frame units, series connected together to form an elongated web comprising, a stationary upper die having an upper surface on which said web is supported and further having punch channels opened for pressing punched tape portions against web and a tape channel internally lying perpendicular to said punch channels, a lower die having punch members passing through said punch channels to punch the tape, said punch members being provided with suction means for suctioning the punched tape portion by vacuum so as to register said tape portion with a pasting position of said web, said lower die further having means for moving said punch members toward and away from said upper die such that the terminal ends of said punch members project outwardly of the upper surface of said upper die at the end of the movement of said punch members toward said upper die, heating means spaced a predetermined distance from said upper surface of said upper die and biased by a spring means toward said upper die, means for feeding a predetermined length of said tape passing through said tape channel of said upper die, and means for setting the web a predetermined position on said upper surface of said upper die.

* * * * *